US 6,628,070 B2

(12) United States Patent
Van Den Reek et al.

(10) Patent No.: US 6,628,070 B2
(45) Date of Patent: Sep. 30, 2003

(54) ELECTRO-OPTICAL DEVICE WITH COVER HAVING A FIRST WALL INDENTATION FOR ACCOMMODATING CONTROL ELECTRONICS

(75) Inventors: Johannes Nicolaas Johanna Maria Van Den Reek, Heerlen (NL); Klaas Willem Kerkhof, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 4 days.

(21) Appl. No.: 10/008,213

(22) Filed: Nov. 8, 2001

(65) Prior Publication Data

US 2002/0067126 A1 Jun. 6, 2002

(30) Foreign Application Priority Data

Nov. 8, 2000 (EP) .............................. 00203927

(51) Int. Cl.[7] .............................. H01J 1/62; H05B 33/00
(52) U.S. Cl. ........................................ 313/512; 313/504
(58) Field of Search .............................. 313/504, 509, 313/512; 315/169.3; 427/66

(56) References Cited

U.S. PATENT DOCUMENTS

| 5,076,673 A | * | 12/1991 | Lynam et al. ............... 359/271 |
| 5,444,557 A | * | 8/1995 | Spitzer et al. ................ 349/42 |
| 5,882,761 A | | 3/1999 | Kawami et al. .............. 428/69 |
| 6,201,346 B1 | * | 3/2001 | Kusaka ........................ 313/504 |

FOREIGN PATENT DOCUMENTS

JP 2000215982 A * 8/2000 ........... H05B/33/02

* cited by examiner

*Primary Examiner*—Ashok Patel
*Assistant Examiner*—Glenn D. Zimmerman

(57) ABSTRACT

An electro-optical device comprises a stack (2) of layers on a substrate (1), which stack of layers includes an organic luminescent layer (5) sandwiched between electrode layers (3, 4). A hollow cover (10) is provided over the stack (2) and connected to the substrate (1) in a gastight manner. A water getter (12) is accommodated in the cover (10) so as to abut against a wall (11), which extends along the stack (2). The wall (11) has an indentation (13) accommodating control electronics (14) used to operate the device. The control electronics (14) may be connected to the device by way of a flexible toil (15) having conductor tracks (16), and fixed in the indentation (13) by way of an adhesive (17).

5 Claims, 1 Drawing Sheet

ELECTRO-OPTICAL DEVICE WITH COVER HAVING A FIRST WALL INDENTATION FOR ACCOMMODATING CONTROL ELECTRONICS

BACKGROUND AND SUMMARY

The invention relates to an electro-optical device comprising:
- a light-transmitting substrate;
- a stack of layers on the substrate, which stack comprises a first, light-transmitting electrode layer near the substrate, a second electrode layer and an organic electroluminescent layer between the first and the second electrode layer;
- a hollow cover placed over the stack, which cover is connected to the substrate in a gastight manner and has a first wall extending along the stack; and
- a water-binding getter accommodated in the cover so as to abut against the first wall.

Such an electro-optical device is disclosed in U.S. Pat. No. 5,882,761.

By injecting electrons through one electrode layer into the luminescent layer and injecting holes through the other electrode layer, light is generated in said layer by combining holes and electrons. A higher voltage across the electrodes results in a stronger light emission. This effect can be annihilated, however, by moisture resulting from the manufacturing process or moisture originating from the surroundings.

For this reason, in the known device, the stack of layers is situated in a gastight space formed by the substrate and the cover, and use is made of a water-binding getter.

The device is operated by means of control electronics, for example on a printed circuit board, enabling, for example, the voltage across the electrodes to be controlled or varied.

A drawback of the known device resides in that the combination of the device and the control electronics thus takes up too much space.

It is an object of the invention to provide an electro-optical device of the type described in the opening paragraph, which is designed so as to enable the amount of space taken up by the device and the associated control electronics to be limited.

In accordance with the invention, this object is achieved in that the first wall of the cover is provided with an indentation, wherein control electronics is accommodated so as to be electrically connected to the first electrode and the second electrode.

The design of the device enables a compact construction to be achieved. Besides, the device has the advantage that it yields a module wherein control electronics is present near the device's electro-optical element to be operated. The module is a finished building block which can be fed to the assembly line of a larger device, such as a telephone.

The device may comprise a continuous first electrode layer and a continuous second electrode layer. This enables the device to be used as a light source, for example as a backlight. Alternatively, the first and/or the second electrode layer may be segmented, as a result of which images or characters can be formed by energizing segments. This enables the device to be used as a display. It is also possible for the segmentation to comprise essentially parallel lines in one layer and essentially parallel lines, extending transversely thereto, in the other layer, as a result of which characters and images are built up of points. The device may be monochrome or display colors, for example red, green and blue and mixed colors thereof, such as white and orange.

The first electrode layer may be a hole-injecting electrode layer, for example of a metal, such as gold, platinum or silver, which metals are light-transmitting at a small layer thickness, but preferably use is made of, for example, indium tin oxide because of the high light transmission of this material. Alternatively, organic electroconductive polymers may be used, such as polyaniline and poly-3,4-ethylenedioxythiophene (PEDOT) and polymers derived therefrom. The first electrode layer may be a double layer of, for example, indium tin oxide and PEDOT. Said double layer generally leads to an improved hole injection.

The second electrode layer may be an electron-injecting electrode layer, for example of a metal or a metal alloy having a low work function, such as Yb, Ca, Mg:Ag, Li:Al, Ba, or the layer is a laminate of various layers, such as Ba/Al or Ba/Ag.

The electroluminescent layer may basically comprise an organic electroluminescent material of either comparatively high or comparatively low molecular weight. Such a material may have an essentially conjugated skeleton, such as polythiophenes, polyphenylenes, polythiophenevinylenes, in particular, for example, blue-emitting poly(alkyl) fluorenes and/or red, green or yellow-emitting poly-p-phenylenevinylenes.

The substrate may be of, for example, a synthetic resin such as thermoplast, or of glass, such as quartz glass, or of a ceramic material.

For the getter use can be made of a hygroscopic substance which is fixed in the cover, for example, by compression or sintering. Examples of such a substance include BaO, CaO, $CaSO_4$, $Ba(ClO_4)$ and $Ca(ClO_4)$.

A drawback of a glass cover, as used in the known device, is its comparatively large wall thickness, which is necessary for sufficient mechanical strength. This wall thickness also results in a comparatively large weight.

Therefore, it is favorable to manufacture the cover from a metal, for example, aluminum or chrome nickel steel. Chrome nickel steel is attractive because, in combination with a glass substrate, its thermal expansion is close to that of the substrate, so that the cover-substrate connection is capable of withstanding comparatively large temperature variations. Besides, in this case the cover can be readily manufactured from sheet material or strip material, for example by deep drawing.

It is favorable for the control electronics to be present on a flexible foil with conductor tracks connecting the control electronics with the first and the second electrode. This is attractive because the foil can be readily folded in two so as to cover the conductor tracks and thus separate them from the cover. As a result, no additional insulator has to be provided.

The control electronics, generally an I.C., can be fixed in the indentation by means of an adhesive. This measure has the advantage that it yields a robust, easily handled unit.

If the cover is made of a metal, the cover can be connected to the substrate by means of, for example, a sealing means wherein electrically insulating power is dispersed. Said powder may consist of, for example, glass beads. This enables the adhesive, for example an epoxy glue, to act directly on the cover and the substrate, without the need of special measures to preclude that the metal cover short-circuits conductors situated on the substrate and running to the electrodes. In this case, the powder acts as a spacer.

These and other aspects of the invention will be apparent from and elucidated with reference to the embodiment(s) described hereinafter.

DETAILED DESCRIPTION

Figure 1:
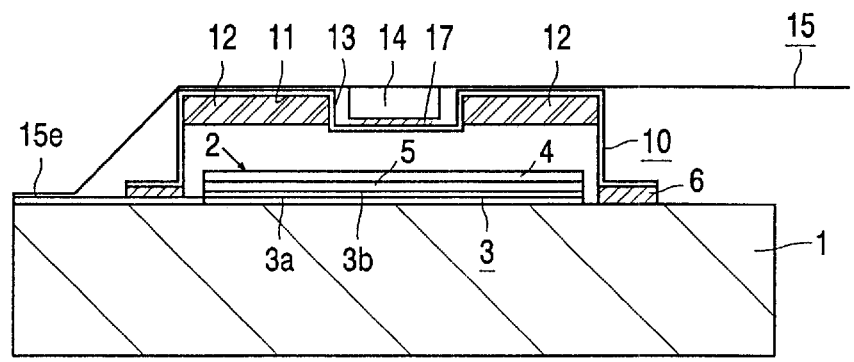
FIG. 1 is a diagrammatic, cross-sectional view of the device.
Figure 2:
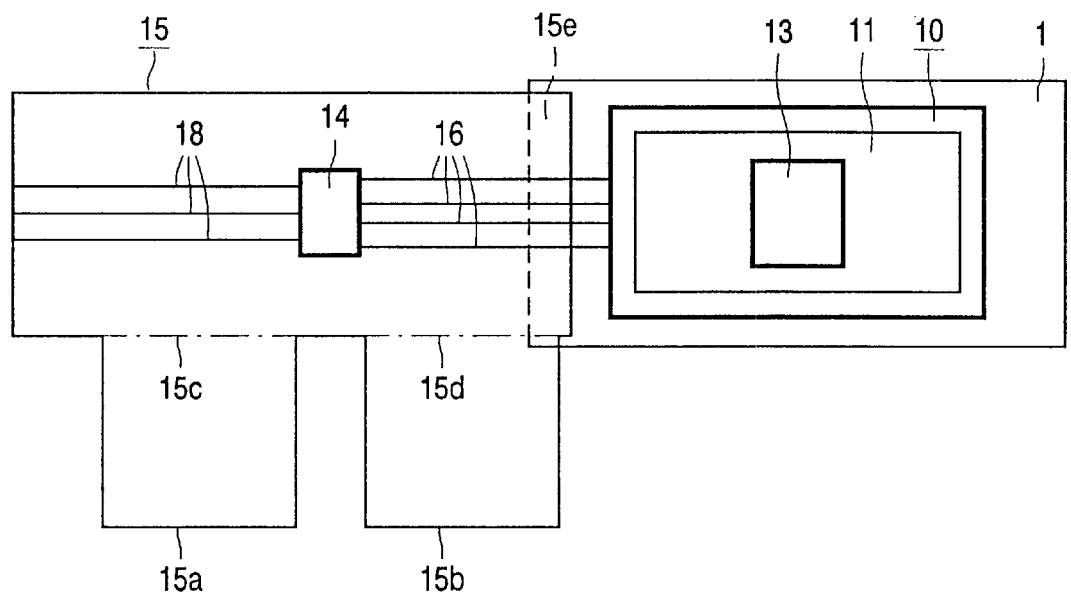
FIG. 2 is a plan view of the device of FIG. 1 during manufacture.

In FIG. 1 and FIG. 2, the electro-optical device comprises a light-transmitting substrate 1 which, in the Figures, is made of glass. A stack 2 of layers is provided on the substrate 1, which stack includes a first light-transmitting electrode layer 3 near the substrate 1, a second electrode layer 4 and an organic electroluminescent layer 5 between the first electrode layer 3 and the second electrode layer 4. In FIG. 1, the first electrode layer 3 is a double layer comprising a layer of indium tin oxide 3a and a layer of poly-3,4-ethylenedioxythiophene 3b. The second electrode layer 4 is made of barium and aluminum, and the electroluminescent layer 5 is made of poly-p-phenylenevinylene. A hollow cover 10 is provided over the stack 2 so as to be connected to the substrate 1 in a gastight manner. The cover 10 has a first wall 11 which extends along the stack 2. A water-binding getter 12 is accommodated in the cover 10 so as to abut against the first wall 11. In FIG. 1, the getter comprises CaO.

The first wall 11 of the cover 10 has an indentation 13 wherein control electronics 14 is accommodated, which is electrically connected to the first electrode 3 and the second electrode 4. The control electronics 14 comprises an integrated circuit. The cover 10 shown in the Figures is made of a metal, namely chrome nickel steel.

The control electronics 14 is present on a flexible foil 15, of polyimide in these Figures, with copper conductor tracks 16 connecting the control electronics 14 to the first electrode layer 3 and the second electrode layer 4.

The control electronics 14 is fixed in the indentation 13 by means of an adhesive 17, i.e. an epoxy glue in the Figures.

The cover 10 is connected to the substrate 1 by means of a sealing agent 6 wherein electrically insulating powder is dispersed, i.e. an epoxy glue with glass beads in FIG. 1.

The device shown in FIG. 1 is obtained from the semi-finished product shown in FIG. 2 by folding the flaps 15a and 15b of the foil 15 about folding lines 15c and 15d, respectively. If necessary, the folded portions can be attached using an adhesive. The flap 15b covers the conductor patterns 16, and the flap 15a covers the conductors 18. The foil 15 is already connected to the substrate 1 via a connection strip 15e, also see FIG. 1, by means of an anisotropic conductive glue, which is thermally cured. The foil 15 is subsequently provided over the cover 10, and the control electronics 14 is secured in the indentation 13 by means of the adhesive 17.

What is claimed is:

1. An electro-optical device comprising:

a light-transmitting substrate (1);

a stack (2) of layers on the substrate (1), which stack comprises a first, light-transmitting electrode layer (3) near the substrate (1), a second electrode layer (4) and an organic electroluminescent layer (5) between the first (3) and the second electrode layer (4);

a hollow cover (10) placed over the stack (2), which cover is connected to the substrate (1) in a gastight manner and has a first wall (11) extending along the stack (2); and a water-binding getter (12) accommodated in the cover (10) so as to abut against the first wall (11), characterized in that the first wall (11) of the cover (10) is provided with an indentation (13), wherein control electronics (14) is accommodated so as to be electrically connected to the first electrode (3) and the second electrode (4).

2. An electro-optical device as claimed in claim 1, characterized in that the cover (10) is made of a metal.

3. An electro-optical device as claimed in claim 1, characterized in that the control electronics (14) is fixed in the indentation (13) by means of an adhesive (17).

4. An electro-optical device as claimed in claim 2, characterized in that the cover (10) is connected to the substrate (1) by means of a sealing agent (6) wherein electrically insulating powder is dispersed.

5. An electro-optical device comprising:

a light-transmitting substrate (1);

a stack (2) of layers on the substrate (1), which stack comprises a first, light-transmitting electrode layer (3) near the substrate (1), a second electrode layer (4) and an organic electroluminescent layer (5) between the first (3) and the second electrode layer (4);

a hollow cover (10) placed over the stack (2), which cover is connected to the substrate (1) in a gastight manner and has a first wall (11) extending along the stack (2); and a water-binding getter (12) accommodated in the cover (10) so as to abut against the first wall (11), wherein the first wall (11) of the cover (10) is provided with an indentation (13) in which control electronics (14) are accommodated so as to be electrically connected to the first electrode (3) and the second electrode (4), and the control electronics (14) are situated on a flexible foil (15) with conductor tracks (16), which connect the control electronics (14) to the first electrode layer (3) and the second electrode layer (4).

* * * * *